(12) United States Patent
Maruyama

(10) Patent No.: US 6,542,009 B2
(45) Date of Patent: Apr. 1, 2003

(54) SIGNAL HOLD CIRCUIT

(75) Inventor: Youhei Maruyama, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/107,707

(22) Filed: Mar. 27, 2002

(65) Prior Publication Data

US 2002/0153927 A1 Oct. 24, 2002

(30) Foreign Application Priority Data

Apr. 13, 2001 (JP) ........................................ 2001-115716

(51) Int. Cl.⁷ ........................... G01R 19/00; G01C 27/02
(52) U.S. Cl. .............................. 327/59; 327/60; 327/95; 327/96
(58) Field of Search ............................. 27/58–62, 91, 27/94, 95, 96

(56) References Cited

U.S. PATENT DOCUMENTS 4,992,674 A * 2/1991 Smith ........................... 327/59
5,315,168 A * 5/1994 Norton, Jr. .................... 327/58
5,546,027 A * 8/1996 Shinozaki et al. ............. 327/59
5,978,664 A * 11/1999 Janssen ........................ 327/59

* cited by examiner

Primary Examiner—Toan Tran
(74) Attorney, Agent, or Firm—William B. Kempler; W. James Brady; Frederick J. Telecky, Jr.

(57) ABSTRACT

A peak hold circuit that can operate to follow changes in peak value even if the changes are abrupt. The peak hold circuit (1) of the present invention has current control circuit (31), auxiliary switch element (25), and auxiliary constant current circuit (26). Current control circuit (31) counts the number of reference clock pulses RCK after output signal Vout becomes higher than analog voltage DI. When the number of clock pulses counted reaches a prescribed number or larger, auxiliary switch element (25) is turned on to operate auxiliary constant current circuit (26) to increase the amount of drop of output signal Vout per unit time. Consequently, even if output signal Vout becomes higher than the peak value of analog voltage DI, it is possible, by increasing the amount of drop of output signal Vout to make output signal Vout lower than analog voltage DI in a shorter amount of time than in the case in the conventional technology. In this way, output signal Vout can be changed to follow the peak value of analog voltage DI. The circuit can be modified to follow a bottom signal.

16 Claims, 3 Drawing Sheets

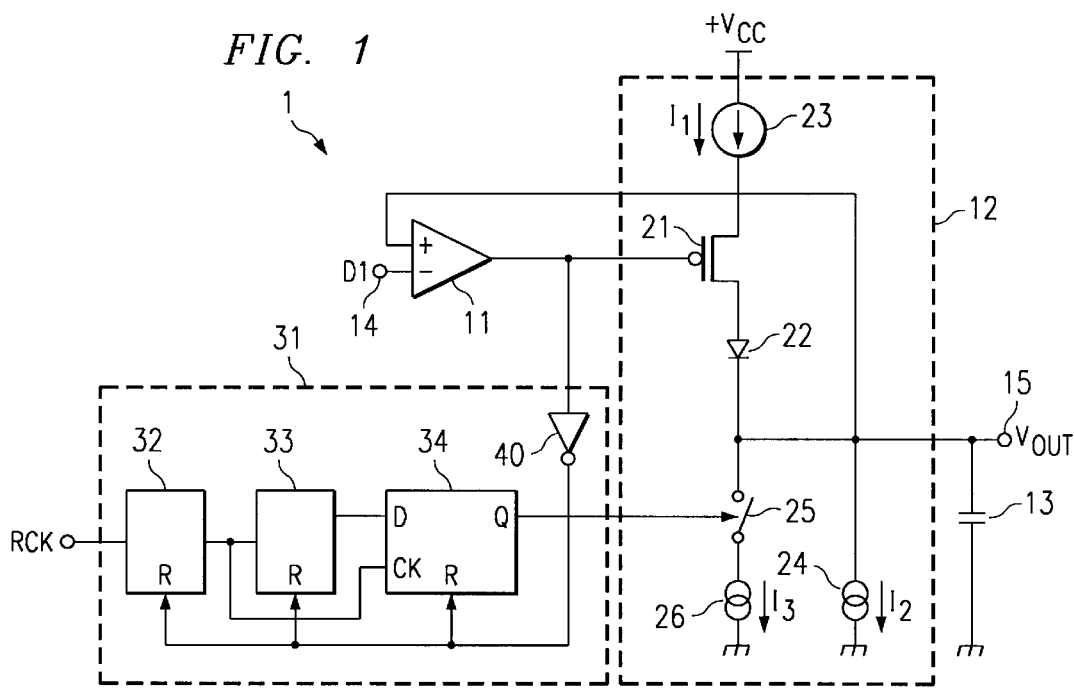
FIG. 1
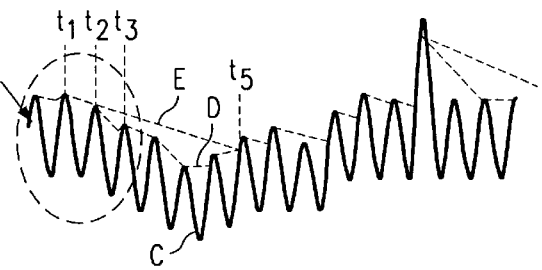
FIG. 2A
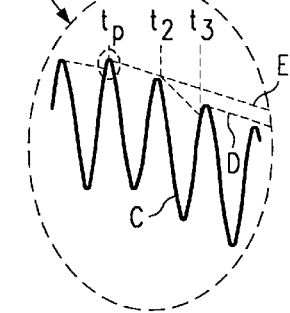
FIG. 2B
FIG. 2C

SIGNAL HOLD CIRCUIT

FIELD OF THE INVENTION

The present invention pertains to the technical field of signal hold circuits. In particular, the present invention pertains to a peak hold circuit that outputs the signal of a waveform that varies to follow the peak value of a prescribed signal.

BACKGROUND OF THE INVENTION

The Read-channel circuit of an MOD (Magnetic optical disk) has a peak hold circuit that outputs the peak value of an analog signal that increases and decreases periodically.

As shown in FIG. 4, a conventional peak hold circuit 101 has comparator 111, current output circuit 112 and capacitor 113.

The inverting input terminal (−) of comparator (111) is connected to input terminal (114). The comparator outputs a comparison signal, to be described later, corresponding to the analog voltage DI input to input terminal (114).

Current output circuit (112) has switch transistor (121), diode (122), source-side constant current circuit (123), and sink-side constant current circuit (124).

The output terminal of comparator (111) is connected to the gate terminal of switch transistor (121). Switch transistor (121) is turned on or off corresponding to the comparison signal output from comparator (111). Source-side constant current circuit (123) is connected to the terminal of capacitor (113) on the high potential side via switch transistor (121) and diode (122). When switch transistor (121) is turned on, a source-side constant current $I_1$ is supplied to capacitor (113).

Sink-side constant current circuit (124) is directly connected to the terminal of capacitor (113) on the high potential side, while the terminal of capacitor (113) on the low potential side is grounded. Sink-side constant current circuit (124) always absorbs sink constant current $I_2$ from capacitor (113).

As a result, when switch transistor (121) is turned on, capacitor (113) is charged by constant current $(I_1-I_2)$ as the difference between source constant current $I_1$ and sink constant current $I_2$, and the voltage across capacitor (113) rises. On the other hand, when switch transistor (121) is turned off, source-side constant current circuit (123) is cut off from capacitor (113), and capacitor (113) is discharged as sink constant current $I_2$ from capacitor (113) is sunk. As a result, the voltage across capacitor (113) drops.

The terminal of capacitor (113) on the high potential side is connected to output terminal (115). The voltage across capacitor (113) is output, from output terminal (115) as output signal Vout, to an external circuit not shown in the figure.

Output terminal (115) is connected to the non-inverting input terminal (+) of comparator (111). The aforementioned analog voltage DI and output signal Vout are input to comparator (111). Comparator (111) compares output signal Vout with analog voltage DI, generates a comparison signal according to the comparison, and outputs the comparison signal to the gate terminal of switch transistor (121). The comparison signal is a low-level signal if output signal Vout is lower than analog voltage DI, and becomes a high-level signal if the output signal is higher than the analog voltage.

Switch transistor (121) is a P-channel MOS transistor. It will be turned on when the comparison signal is low level, and will be turned off when the comparison signal is high level. As described above, output signal Vout varies such that it drops when output signal Vout is higher but rises when it is lower than analog voltage DI. The amount of rise in output voltage Vout per unit time is determined by constant current $(I_1-I_2)$, that is, the difference between source constant current $I_1$ and sink constant current $I_2$. The amount of drop per unit time is determined by sink constant current $I_2$.

Analog voltage DI is an AC signal with a prescribed frequency, such as a voice signal. The relationship between analog voltage DI and output signal Vout will be explained with reference to FIG. 5. With time plotted on the abscissa and voltage on the ordinate, the waveforms of said analog voltage DI and output signal Vout are shown as curves (W) and (X) in FIG. 5, respectively.

When output signal Vout is lower than analog voltage DI and analog voltage DI rises, output signal Vout rises. When analog voltage DI rises and output signal Vout is lower than analog voltage DI at the time when the analog voltage reaches the peak value (symbol $t_p$ in the figure), analog voltage DI drops after time $t_p$ when it reaches the peak value. On the other hand, output signal Vout rises. After that, the magnitude relationship between output signal Vout and analog voltage DI is reversed. The reversal time is indicated by $t_b$ in FIG. 5.

After time $t_b$ when the magnitude relationship between output signal Vout and analog voltage DI is reversed, output signal Vout becomes higher than analog voltage DI. Capacitor (113) is discharged as sink constant current $I_2$ from capacitor (113) is sunk. As a result, output signal Vout starts to drop. The amount of drop of output signal Vout per unit time is determined by the aforementioned sink constant current $I_2$. However, output signal Vout drops more gradually than does analog voltage DI because the sink current $I_2$ is preset to a small value.

During the period when output signal Vout drops, the AC analog voltage DI first drops and then rises until reaching the peak value. However, depending on the magnitude of the peak value of analog voltage DI, the trace of the voltage value of output signal Vout and the trace of the voltage value of analog voltage DI will or will not cross before analog voltage DI rises to the peak value.

If analog voltage DI has a large peak value and the trace of the voltage value of output signal Vout crosses the trace of the voltage value of analog voltage DI, the magnitude relationship with voltage signal Vout is reversed after the crossing time, and output signal Vout becomes lower than analog voltage DI. Therefore, output signal Vout is able to rise until it becomes higher than analog voltage DI, and reaches a voltage level that is almost the same as the peak value of analog voltage DI.

However, if analog voltage DI has a small peak value and the trace of the voltage value of output signal Vout does not cross the trace of the voltage value of analog voltage DI, for example, as shown by curve (Z) in FIG. 6, output signal Vout is still higher than analog voltage DI, but is unable to reach a voltage level that is almost the same as the peak value of analog voltage DI. If the time period during which output voltage Vout is higher than analog voltage DI ($T_j$ in the figure) is long, the waveform of output signal Vout is unable to draw the correct envelope of the peak value since output signal Vout is not on almost the same voltage level as the peak value of analog voltage DI during that period, as shown by curve (Z) in FIG. 6.

As described above, since the amount of drop of output signal Vout per unit time is determined by the amount of sink constant current $I_2$ generated by sink-side constant current circuit (124), if the amount of sink constant current $I_2$ is increased, the amount of drop of output signal Vout per unit time can be increased. Therefore, even if analog voltage DI drops sharply, the output signal Vout is able to drop below analog voltage DI in a relatively short amount of time to match with the peak value. Sink constant current $I_2$ flows constantly, however. The power consumption will be increased if the amount of sink constant current in constant flow is increased. Also, if the amount of rise or amount of drop of output signal Vout per unit time is increased, the flatness of the waveform of output signal Vout will deteriorate.

One aspect of the present invention is to solve the problem of the aforementioned conventional technology by providing a technology, such as a peak hold circuit, that can obtain and output peak value correctly to follow the variation in analog voltage.

SUMMARY OF INVENTION

In order to realized the aforementioned purpose, one aspect of the present invention provides a signal hold circuit having the following: a comparison circuit that compares an input signal with an output signal and outputs a comparison signal, a capacitor used for generating the aforementioned output signal, a first constant current circuit used for supplying a first current to the aforementioned capacitor, a second constant current circuit used for supplying a second current with opposite polarity to that of the first current to the aforementioned capacitor, a third constant current circuit used for supplying a third current with opposite polarity to that of the first current to the aforementioned capacitor, a first switch element that is electrically connected between the aforementioned capacitor and the first constant current circuit and is turned on corresponding to the aforementioned comparison signal, a rectifying element that is electrically connected between the aforementioned first switch element and the aforementioned capacitor, a second switch element that is connected between the aforementioned capacitor and the third constant current circuit, and a control circuit that uses the aforementioned comparison signal as its input and outputs a control signal for closing the second switch element when the comparison signal does not change during a prescribed amount of time.

In the signal hold circuit of one aspect of the present invention, it is preferred that the aforementioned input signal be an analog signal that varies periodically and the aforementioned prescribed amount of time be longer than one period of the aforementioned analog signal. Also, it is preferred that the aforementioned prescribed amount of time be shorter than two periods of the analog signal.

In the signal hold circuit of one aspect of the present invention, it is preferred that the aforementioned control circuit have a counter that is reset by a logical change in the aforementioned comparison signal and measures the aforementioned prescribed amount of time by counting a clock signal.

In addition, in the signal hold circuit of one aspect of the present invention, it is preferred that the aforementioned output signal be the peak holding signal of the aforementioned input signal.

The signal hold circuit of one aspect of the present invention has a control circuit that changes the amount of the current used to charge or discharge the capacitor when the polarity of the comparison signal does not change in a prescribed amount of time.

The polarity of the comparison signal corresponds to the magnitude relationship between the input and output signals. If the polarity of the comparison signal does not change in a prescribed amount of time, the output signal remains at a level that is either higher or lower than the input signal, and the magnitude relationship between the output and input signals does not change.

As described above, if the polarity of the comparison signal does not change in a prescribed amount of time, which is predetermined, the amount of the current for charging or discharging the capacitor will be changed by the control circuit to change the amount of variation in the output signal per unit time.

In particular, in the case of changing the output signal to follow the change in the input signal, for example, when the change in the output signal is unable to follow a sharp change in the input signal, the polarity of the comparison signal does not change over a long amount of time, and the magnitude relationship does not change, either.

When the amount of variation of the output signal per unit time is increased by using the control circuit to change the amount of current used to charge or discharge the capacitor if the polarity of the comparison signal does not change in a prescribed amount of time, the magnitude relationship will be reversed so that the output signal can be changed to follow the change in the input signal.

When the second switch element is turned on by the control circuit, in addition to the constant current flowing to the second constant current circuit that is connected in parallel with the third constant current circuit (auxiliary constant current circuit), the auxiliary constant current (the third current) flowing to the auxiliary constant current circuit also flows to the capacitor. Therefore, the amount of current used to charge or discharge the capacitor is changed.

A clock signal (reference clock signal) is input to the control circuit. The control circuit is constituted appropriately to count the number of reference clock pulses to measure a prescribed amount of time. In that case, the number of counted clock pulses is reset when the polarity of the comparison signal changes. Since the measured time is reset when the polarity of the comparison signal changes, measurement of a prescribed amount of time can always start from the point in time when the polarity of the comparison signal changes.

BRIEF DESCRIPTION OF THE DRAWINGS

FIG. 1 is a block diagram illustrating a peak hold circuit as an embodiment of the present invention.

FIG. 2 is a timing chart explaining the relationship between the output signal and the analog voltage for the peak hold circuit that is an embodiment of the present invention.

REFERENCE NUMERALS AND SYMBOLS AS SHOWN IN THE DRAWINGS

Figure 3:
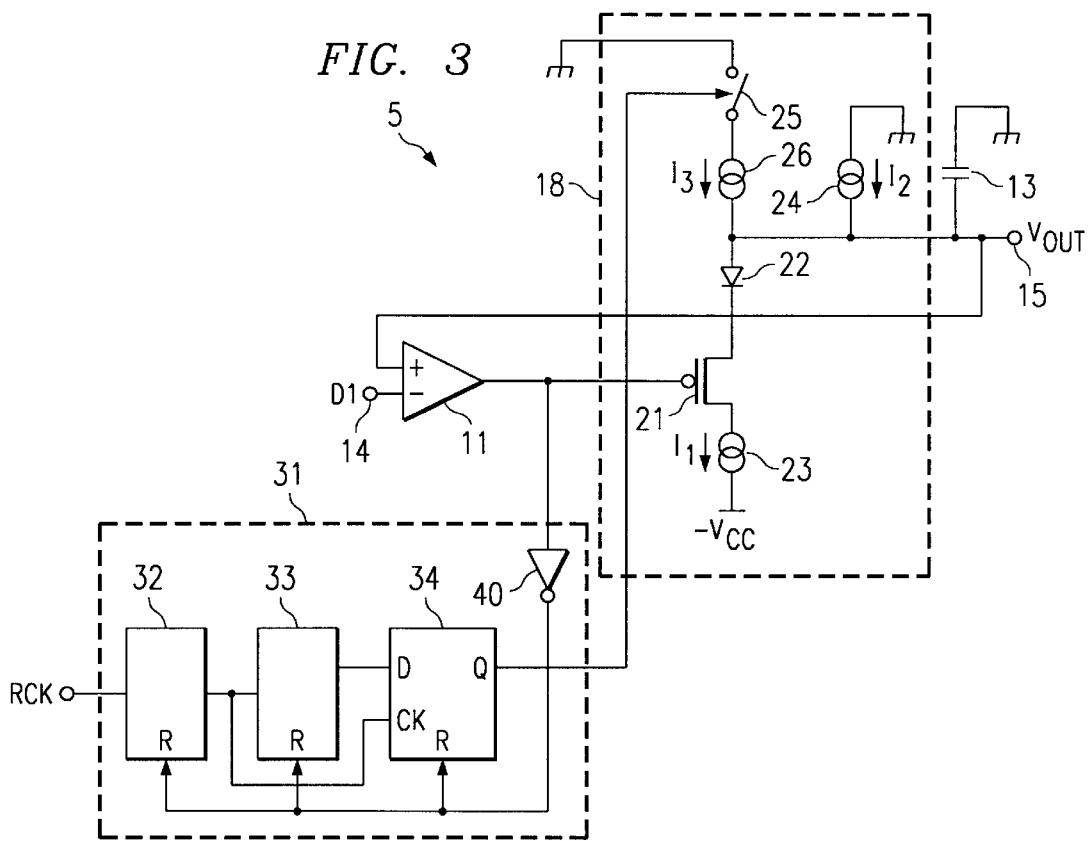
FIG. 3 is a block diagram illustrating a bottom hold circuit as another embodiment of the present invention.
Figure 4:
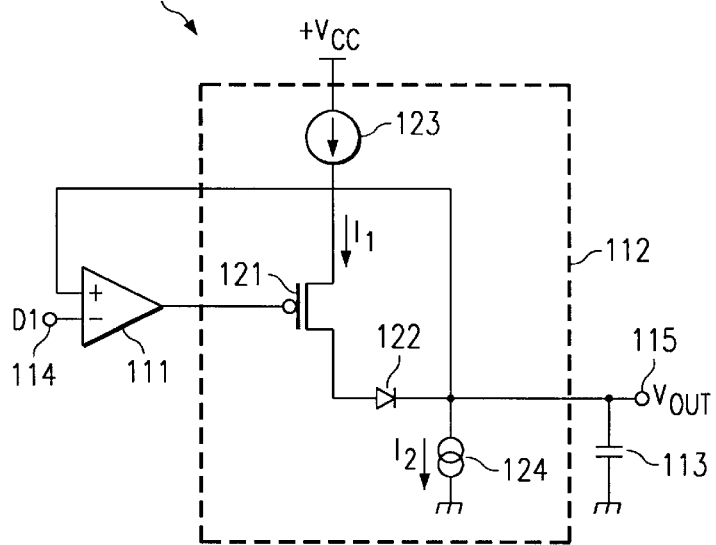
FIG. 4 is a block diagram illustrating a conventional peak hold circuit.
Figure 5A:
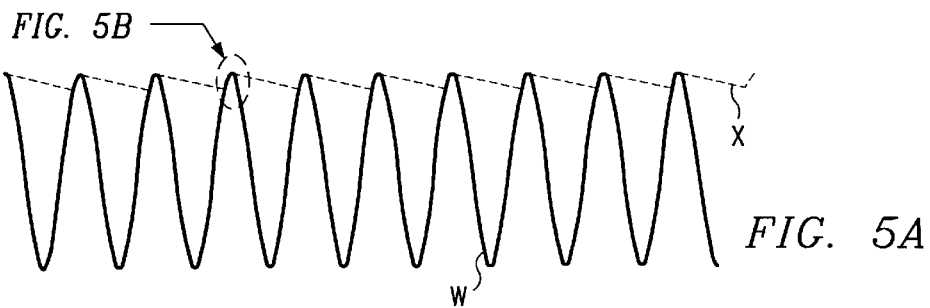
FIG. 5 is the first timing chart explaining the relationship between the output signal and analog voltage of the conventional peak hold circuit.
Figure 5B:
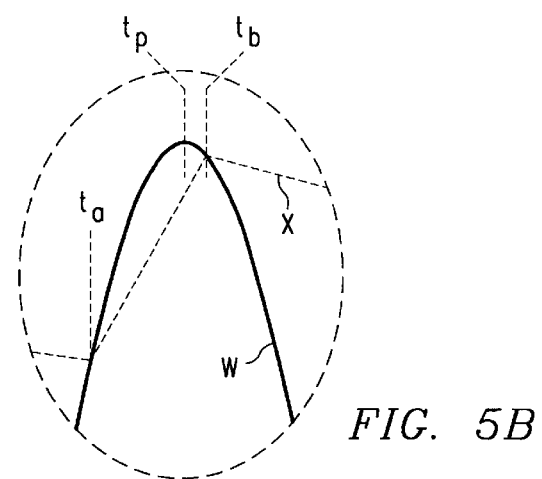
Figure 6:
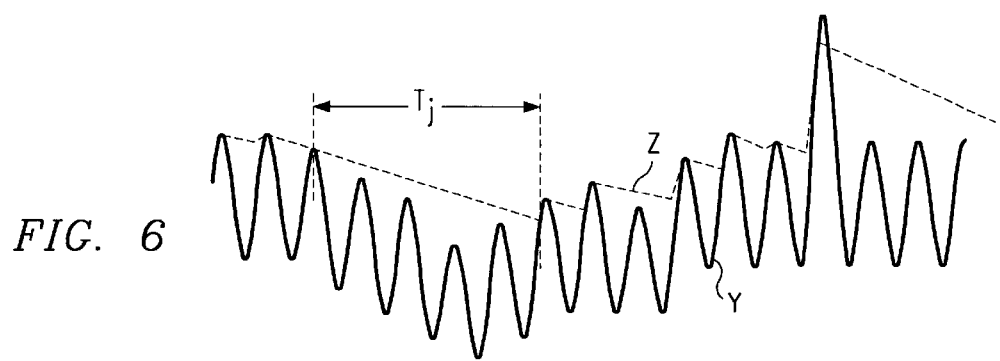
FIG. 6 is the second timing chart explaining the relationship between the output signal and analog voltage of the conventional peak hold circuit.

In the FIG. 1 represents a peak hold circuit, 11 represents a comparator, 12 represents a current output circuit, 13 represents a capacitor, 21 represents a switch transistor, 23 represents a source-side constant current circuit, 24 represents a sink-side constant current circuit, 25 represents an auxiliary switch element, 26 represents an auxiliary constant current circuit

DESCRIPTION OF EMBODIMENT

An embodiment of the present invention will be explained in the following with reference to figures.

In FIG. 1, (1) represents a peak hold circuit disclosed in an embodiment of the present invention used for the Read-channel circuit of an MOD. As shown in FIG. 1, peak hold circuit (1) has comparator (11), current output circuit (12), capacitor (13), and current control circuit (31).

The inverting input terminal (−) of comparator (11) is connected to input terminal (14). A comparison signal, to be described later, is output in correspondence to analog voltage DI input to input terminal (14).

Current output circuit (12) has switch transistor (21) as an example of the main switch element, diode (22), source-side constant current circuit (23), sink-side constant current circuit (24), auxiliary switch element (25), and auxiliary constant current circuit (26).

The output terminal of comparator (11) is connected to the gate terminal of switch transistor (21). Switch transistor (21) is turned on or off in correspondence to the comparison signal output from comparator (11). Source-side constant current circuit (23) is connected to the terminal of capacitor (13) on the high potential side via switch transistor (21) and diode (22). The terminal of capacitor (13) on the low potential side is grounded. When switch transistor (21) is turned on, source constant current $I_1$ is supplied from source-side constant current circuit (23) to capacitor (13). Sink-side constant current circuit (24) is directly connected to the terminal of capacitor (13) on the high potential side to continuously sink constant current $I_2$ from capacitor (13).

When switch transistor (21) is turned on, constant current ($I_1-I_2$), that is, the difference between source constant current $I_1$ and sink constant current $I_2$, is supplied to capacitor (13). Capacitor (13) is charged by constant current ($I_1-I_2$), and the voltage across capacitor (13) rises. On the other hand, when switch transistor (21) is turned off, source constant current circuit (23) is cut off from capacitor (13). Sink constant current $I_2$ is absorbed from capacitor (13) by sink-side constant current circuit (24) to discharge capacitor (13). As a result, the voltage across capacitor (13) drops.

The terminal of capacitor (13) on the high potential side is connected to output terminal (15), and the voltage across capacitor (13) is output from output terminal (15), as output signal Vout, to an external circuit (not shown in the figure).

Output terminal (15) is connected to the non-inverting input terminal (+) of comparator (11). Said analog voltage DI and output signal Vout are input to comparator (11). Comparator (11) compares analog voltage DI with output signal Vout, generates a comparison signal that indicates the comparison result, and outputs it to the gate terminal of switch transistor (21). The comparison signal is low level if output signal Vout is lower than analog voltage DI, and is high level if output signal Vout is higher than analog voltage DI.

Switch transistor (21) a P-channel MOS transistor. The transistor is turned on when the comparison signal is low level. As a result, capacitor (13) is charged by constant current ($I_1-I_2$). The transistor is turned off when the comparison signal is high level. As a result, capacitor (13) is discharged by sink constant current $I_2$. Since the comparison signal is low level if the output signal is lower than analog voltage DI and is high level if the output signal is higher, as described above, output signal Vout varies such that it drops when its voltage value is greater than analog voltage DI and rises when its voltage value is smaller. The amount of rise of output signal Vout per unit time is determined by constant current ($I_{1-I2}$), that is, the difference between source constant current $I_1$ and sink constant current $I_2$. The amount of drop per unit time is determined by sink constant current $I_2$.

Analog voltage DI is an AC signal with a prescribed frequency, such as a voice signal. The relationship between analog voltage DI and output signal Vout will be explained with reference to FIG. 2. With time plotted on the abscissa and voltage on the ordinate, the waveforms of said analog voltage DI and output signal Vout are shown in FIG. 2 as curves (C) and (D), respectively.

When output signal Vout is lower than analog voltage DI and analog voltage DI rises, output signal Vout rises. When analog voltage DI rises and output signal Vout is lower than analog voltage DI at the time $t_p$ when the analog voltage reaches the peak value, analog voltage DI drops after time $t_p$ when it reaches the peak value. On the other hand, output signal Vout rises. After that, the magnitude relationship between output signal Vout and analog voltage DI is reversed. The reversal time is indicated by $t_1$ in FIG. 2.

After time $t_1$ when the magnitude relationship between analog voltage DI and output signal Vout is reversed, output signal Vout becomes higher than analog voltage DI. Capacitor (13) is discharged as sink constant current $I_2$ from capacitor (13) is sunk. As a result, output signal Vout starts to drop. The amount of drop of output signal Vout per unit time is determined by the amount of the aforementioned sink constant current $I_2$. However, output signal Vout drops more gradually than does analog voltage DI because the sink current $I_2$ is preset to a small value.

During the period when output signal Vout drops, the AC analog voltage DI first drops and then rises until reaching the peak value. However, depending on the magnitude of the peak value of analog voltage DI, the trace of the voltage value of output signal Vout and the trace of the voltage value of analog voltage DI will or will not cross before analog voltage DI rises to the peak value.

If the trace of the voltage value of output signal Vout crosses the trace of the voltage value of analog voltage DI, the magnitude relationship with voltage signal Vout is reversed again after the crossing time, and output signal Vout becomes lower than analog voltage DI. Therefore, output signal Vout is able to rise until it becomes higher than analog voltage DI, and reaches a voltage level that is almost the same as the peak value of analog voltage DI.

However, if the trace of the voltage value of output signal Vout does not cross with the trace of the voltage value of analog voltage DI, output signal Vout is still higher than analog voltage DI, but is unable to reach a voltage level that is almost the same as the peak value of analog voltage DI.

Peak hold circuit (1) disclosed in the present embodiment counts reference clock pulses RCK. When the number of counted clock pulses exceeds a prescribed number to be described later, the amount of drop of output signal Vout per unit time is increased. In this case, reference clock RCK is a clock used as the reference for the period during which analog voltage DI is output. The maximum period of analog voltage DI is set in the range 2–11 reference clock pulses RCK.

In the present embodiment, counting of reference clock pulses RCK is started and the number of clock pulses counted starts to increase from the time (time $t_1$ in FIG. 2) when the magnitude relationship between output signal Vout and analog voltage DI is reversed and output signal Vout becomes higher than analog voltage DI. After that, when the magnitude relationship between output signal Vout and analog voltage DI is reversed and output signal Vout becomes lower than analog voltage DI, the number of clock pulses counted is reset to 0. Then, counting is started again at the time when the magnitude relationship is reversed again and output signal Vout becomes higher than analog voltage DI.

In the present embodiment, if the number of reference clock pulses RCK counted is greater than 11, the amount of drop of output signal Vout per unit time is increased. The time at which the amount of drop is increased is indicated by symbol $t_2$ in FIG. 2.

As described above, if the period of 11 reference clock pulses RCK is identical to the maximum period of analog voltage DI and output signal Vout is higher than analog voltage DI in each period of analog voltage DI, the number of reference clock pulses RCK counted does not exceed 11. Consequently, when the number of clock pulses counted becomes greater than 11, output signal Vout remains in a state higher than the peak value of analog voltage DI that appeared initially after counting was started and is unable to follow that peak value. This problem occurs because the amount of drop of output signal Vout is too small. Therefore, in the present embodiment, as described above, the amount of drop of output signal Vout is increased when the number of clock pulses counted exceeds 11.

As a result, after the amount of drop of output signal Vout is increased, the magnitude relationship between output signal Vout and analog voltage DI is reversed before the peak value of analog voltage DI appears, and output signal Vout becomes lower than analog voltage DI. That time is indicated with symbol $t_3$ in FIG. 2. When output signal Vout becomes lower than analog voltage DI after time $t_3$, output signal Vout rises to a voltage that is almost the same as the peak value of analog voltage DI.

For purposes of comparison, the waveform of output signal Vout when using a conventional peak hold circuit (101) is shown by curve (E) in FIG. 2. As can be seen from curve (E), output signal Vout of the conventional circuit is still higher than analog voltage DI at time $t_3$ when output signal Vout is made lower than analog voltage DI by using peak hold circuit (1) disclosed in the present embodiment. The output signal eventually becomes lower than analog voltage DI at time $t_5$ after a very long amount of time has passed since time $t_3$. After that, output signal Vout can vary to follow the peak value of analog voltage DI.

As explained above, in peak hold circuit (1) disclosed in the present embodiment, the number of reference clock pulses RCK is counted. When the number exceeds a prescribed number (11 in this case), the amount of drop of output signal Vout per unit time is increased. Consequently, even if the peak value of analog voltage DI drops sharply, output signal Vout is able to become lower than analog voltage DI in a shorter amount of time than in the conventional technology. Since the output signal can change to follow the change in the peak value after it becomes low, the amount of time during which output signal Vout cannot follow the change in the peak value becomes shorter than that in the conventional technology.

Current control circuit (31), auxiliary switch element (25), and auxiliary constant current circuit (26) are used in peak hold circuit (1) disclosed in the present embodiment in order to increase the amount of drop of output signal Vout after the number of reference clock pulses RCK counted becomes greater than 11.

Current control circuit (31) has counter (32), shift register (33), D flip-flop circuit (34), and inverter (40).

Counter (32) divides reference clock pulse RCK at a prescribed frequency dividing rate and outputs it to shift register (33). Shift register (33) delays the divided reference clock pulse RCK by an amount equal to a prescribed number of reference clock pulses RCK (11 in this case) and outputs it to D flip-flop circuit (34).

The output signal of shift register (33) is input to the input terminal D of D flip-flop circuit (34). The reference clock pulse RCK divided by counter (32) is input to clock input terminal CK. When high-level signals are input to both input terminal D and clock input terminal CK, the output signal of output terminal Q becomes high level. Otherwise, the output signal is low level. The output terminal Q of D flip-flip (34) is connected to the control terminal of auxiliary switch element (25) in current output circuit (12).

Auxiliary switch element (25) is turned on when the voltage at output terminal Q is high level. The switch element is turned off when it is low level. Auxiliary switch element (25) is connected in series with auxiliary constant current circuit (26). The serially-connected circuit is connected in parallel with sink-side constant current circuit (24). When auxiliary switch element (25) is turned on, capacitor (13) is discharged by auxiliary constant current I3 generated by auxiliary constant current circuit (26).

During the period when output signal Vout is lower than analog voltage DI, the comparison signal is low level. After the low-level comparison signal is inverted to high level by inverter (40), it is input to the reset terminal of counter (32), shift register (33), and D flip-flop circuit (34) to reset counter (32), shift register (33), and D flip-flop circuit (34).

From this state, when output signal Vout becomes higher than analog voltage DI, the comparison signal becomes high level. After it is inverted to low level by inverter (40), the signal is input to the reset terminal of reset counter (32), shift register (33), and D flip-flop circuit (34). As a result, counter (32), shift register (33), and D flip-flop are all released from the reset state and start to work together. Counter (32) divides the reference clock pulse RCK frequency and outputs it to shift register (33).

The voltage at the output terminal of shift register (33) is low level from the point when output signal Vout becomes higher than analog voltage DI until 11 of reference clock pulses RCK have passed. Since a low level voltage is input to the input terminal D of D flip-flop circuit (34), the signal output from the output terminal Q of D flip-flop circuit (34) is low level. Consequently, auxiliary switch element (25) is turned off, and auxiliary constant current circuit (26) is not connected to capacitor (13). Also, since the comparison signal is high level, switch transistor (21) is turned off, and source-side constant current circuit (23) is not connected to capacitor (13). Consequently, neither source-side constant current circuit (23) nor auxiliary constant current circuit (26) are connected to capacitor (13), and only sink-side constant current circuit (24) is connected to the capacitor. As a result, capacitor (13) is discharged by sink constant current $I_2$, and output signal Vout drops with the same slope as that occurring when no current control circuit (31) is used.

When a period longer than 11 of reference clock pulses RCK has passed since the point in time when output signal Vout became higher than analog voltage DI, the output signal of shift register (33) is switched to high level. At that time, since the divided reference clock pulse RCK is input to the input terminal D of D flip-flop circuit (34) and a high-level voltage is also input to clock terminal CK, the voltage at the output terminal Q of D flip-flop circuit (34) changes from low level to high level. As a result, auxiliary switch element (25) is turned on, and auxiliary constant current circuit (26) is connected to capacitor (13).

Consequently, a constant current ($I_2+I_3$), that is, the sum of sink constant current $I_2$ and auxiliary constant current $I_3$, is sunk from capacitor (13). Capacitor (13) is discharged by the constant current ($I_2+I_3$). Since the constant current ($I_{2+I3}$) absorbed from capacitor (13) during discharge is increased by the amount of auxiliary constant current $I_3$, the amount of drop of output signal Vout per unit time is increased. As described above, the number of reference clock pulses RCK is counted in peak hold circuit (1) disclosed in the present embodiment. When the number exceeds a prescribed number (11 in this case), the amount of drop of output signal Vout per unit time is increased.

In the present embodiment explained above, auxiliary constant current circuit (26) increases the current sunk from capacitor (13) by the amount of auxiliary constant current $I_3$ only when the condition in which output signal Vout is higher than analog voltage DI lasts longer than a prescribed number (11 in this case) of reference clock pulses RCK, so that capacitor (13) is discharged by constant current ($I_2+I_3$). Consequently, unlike in the case of increasing the amount of sink-side constant current $I_2$ that continuously flows, the flatness of the waveform of output signal Vout will not be deteriorated, and the power consumption will not be increased.

In the aforementioned embodiment, switch transistor (21) constituted as a P-channel MOS transistor is used as the main switch element. The main switch element that can be used in the present invention, however, is not limited to this. For example an N-channel MOS transistor can also be used.

Also, the current control circuit is comprised of counter (32), shift register (33), and D flip-flop circuit (34). The present invention, however, is not limited to this. Any circuit can be used as long as auxiliary switch element (25) can be turned on when the polarity of the comparison signal output from comparator (11) does not change within a prescribed amount of time.

In addition, the number of reference clock pulses RCK is counted. When the number of clock pulses counted exceeds 11, the amount of drop of output signal Vout is increased. The number of clock pulses counted is not limited to 11. For example, it is also possible to adopt a configuration such that the amount of drop of output signal Vout is increased when the number of clock pulses counted is larger than 3.

The aforementioned embodiment explains a peak hold circuit (1) in which output signal Vout can follow the change in peak value of analog voltage DI. The signal hold circuit of the present invention, however, is not limited to the aforementioned peak hold circuit (1). For example, as indicated by the symbols shown in FIG. 3, the present invention can also be applied to a bottom hold circuit with a configuration such that output signal Vout can vary to follow the change in the bottom value of an analog voltage DI that varies periodically.

A bottom hold circuit usually has a similar problem to that of the peak hold circuit. That is, when the bottom value of analog voltage DI rises sharply, the amount of rise of output signal Vout is too small so that output signal Vout cannot follow the change in the bottom value. However, bottom hold circuit (5) shown in FIG. 3 counts reference clock pulses RCK in the same way as does peak hold circuit (1) shown in FIG. 1. When the number of clock pulses counted exceeds 11, by contrast to peak hold circuit (1) shown in FIG. 1, the amount of rise of output signal Vout per unit time is increased. Consequently, even if the bottom value of analog voltage DI rises sharply, the amount of time during which output signal Vout cannot follow that rise can be shortened compared with that in the conventional technology.

Even if the input signal changes abruptly, it is possible to output an output signal that follows this change.

What is claimed is:

1. A signal hold circuit comprising:
   a comparison circuit that compares an input signal with an output signal and outputs a comparison signal,
   a capacitor for generating the output signal,
   a first constant current circuit for supplying a first current to the capacitor,
   a second constant current circuit for supplying a second current with the opposite polarity to that of the first current to the capacitor,
   a third constant current circuit for supplying a third current with the opposite polarity to that of the first current to the capacitor,
   a first switch element that is electrically connected between the capacitor and the first constant current circuit and is turned on corresponding to the comparison signal,
   a rectifying element that is electrically connected between the first switch element and the capacitor,
   a second switch element that is connected between the capacitor and the third constant current circuit, and
   a control circuit that uses the comparison signal as its input and outputs a control signal for closing the second switch element when the comparison signal does not change during a prescribed amount of time.

2. The signal hold circuit described in claim 1 wherein the input signal is an analog signal that varies periodically, and the prescribed amount of time is longer than one period of the analog signal.

3. The signal hold circuit described in claim 2 wherein the prescribed amount of time is shorter than two periods of the analog signal.

4. The signal hold circuit described in claim 1 wherein the control circuit has a counter that is reset by a logical change in the comparison signal and measures the prescribed amount of time by counting a clock signal.

5. The signal hold circuit described in claim 1 wherein the output signal is the peak holding signal of the input signal.

6. The signal hold circuit described in claim 2 wherein the control circuit has a counter that is reset by a logical change in the comparison signal and measures the prescribed amount of time by counting a clock signal.

7. The signal hold circuit described in claim 3 wherein the control circuit has a counter that is reset by a logical change in the comparison signal and measures the prescribed amount of time by counting a clock signal.

8. The signal hold circuit described in claim 2 wherein the output signal is the peak holding signal of the input signal.

9. The signal hold circuit described in claim 3 wherein the output signal is the peak holding signal of the input signal.

10. The signal hold circuit described in claim 4 wherein the output signal is the peak holding signal of the input signal.

11. The signal hold circuit described in claim 1 wherein the output signal is the bottom holding signal of the input signal.

12. The signal hold circuit described in claim 5 wherein the input signal is an analog signal that varies periodically, and the prescribed amount of time is longer than one period of the analog signal.

13. The signal hold circuit described in claim 12 wherein the prescribed amount of time is shorter than two periods of the analog signal.

14. The signal hold circuit described in claim 5 wherein the control circuit has a counter that is reset by a logical change in the comparison signal and measures the prescribed amount of time by counting a clock signal.

15. The signal hold circuit described in claim 12 wherein the control circuit has a counter that is reset by a logical change in the comparison signal and measures the prescribed amount of time by counting a clock signal.

16. The signal hold circuit described in claim 13 wherein the control circuit has a counter that is reset by a logical change in the comparison signal and measures the prescribed amount of time by counting a clock signal.

* * * * *